(12) United States Patent
Lue

(10) Patent No.: US 11,393,875 B2
(45) Date of Patent: Jul. 19, 2022

(54) SEMICONDUCTOR DEVICE AND METHOD FOR MANUFACTURING THE SAME

(71) Applicant: MACRONIX INTERNATIONAL CO., LTD., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/024,968

(22) Filed: Sep. 18, 2020

(65) Prior Publication Data
US 2022/0093688 A1   Mar. 24, 2022

(51) Int. Cl.
*H01L 27/24*       (2006.01)
*H01L 45/00*       (2006.01)

(52) U.S. Cl.
CPC ...... *H01L 27/2481* (2013.01); *H01L 27/2409* (2013.01); *H01L 45/06* (2013.01); *H01L 45/1233* (2013.01); *H01L 45/16* (2013.01)

(58) Field of Classification Search
CPC .................................................. H01L 45/1233
See application file for complete search history.

(56) References Cited

U.S. PATENT DOCUMENTS

| 7,804,703 | B2  | 9/2010  | Ha et al. |
| 2008/0175032 | A1 | 7/2008 | Tanaka et al. |
| 2012/0112156 | A1* | 5/2012 | Park .................... H01L 27/2409 257/5 |
| 2015/0214276 | A1 | 4/2015 | Chu |
| 2016/0308128 | A1 | 10/2016 | Liu et al. |
| 2019/0109190 | A1* | 4/2019 | Carlson ............. H01L 27/11582 |

FOREIGN PATENT DOCUMENTS

TW        200913253 A    3/2009

OTHER PUBLICATIONS

TW Office Action dated May 18, 2021 in Taiwan application (No. 109132296).

* cited by examiner

*Primary Examiner* — Mounir S Amer
(74) *Attorney, Agent, or Firm* — McClure, Qualey & Rodack, LLP

(57) ABSTRACT

A semiconductor device includes a substrate, a stack, a conductive pillar, a memory layer, and a salicide layer. The stack is disposed on the substrate, wherein the stack includes a plurality of insulating layers and a plurality of conductive layers that are alternately stacked along a first direction. The conductive pillar penetrates the stack along the first direction. The memory layer surrounds the conductive pillar. The salicide layer surrounds the conductive pillar, wherein the memory layer is disposed between the conductive pillar and the salicide layer.

20 Claims, 12 Drawing Sheets

SEMICONDUCTOR DEVICE AND METHOD FOR MANUFACTURING THE SAME

BACKGROUND OF THE INVENTION

Field of the Invention

The invention relates in general to a semiconductor device, and more particularly to a three-dimensional semiconductor device.

Description of the Related Art

Recently, as the demand for more excellent memory elements has gradually increased, various three-dimensional (3D) memory devices have been provided. Generally speaking, the 3D memory device includes a memory array area composed of a plurality of memory cells. However, the current memory array area still has a problem of current leakage, which prevents the 3D memory element from performing its normal operation. Therefore, there is a need to propose an improved three-dimensional memory device and its manufacturing method to solve the problems faced by the conventional technology.

SUMMARY OF THE INVENTION

The present invention relates to a semiconductor device. Since the semiconductor device of the present application includes a salicide layer, the salicide layer can form a Schottky diode with the conductive layer, and the Schottky diode can be used as a selector so that the selector is electrically connected to the conductive layer and the memory layer, and can provide rectifier property in the memory array. The Schottky diode (selector) can perform unipolar operation on the memory to avoid reverse current conditions, so the sneak path in the memory array can be eliminated, and the problem of current leakage faced by the conventional technique can be solved.

According to one embodiment, a semiconductor device is provided. The semiconductor device includes a substrate, a stack, a conductive pillar, a memory layer, and a salicide layer. The stack is disposed on the substrate, wherein the stack includes a plurality of insulating layers and a plurality of conductive layers that are alternately stacked along a first direction. The conductive pillar penetrates the stack along the first direction. The memory layer surrounds the conductive pillar. The salicide layer surrounds the conductive pillar, wherein the memory layer is disposed between the conductive pillar and the salicide layer.

According to another embodiment, a method for manufacturing a semiconductor device is provided. The method includes the following steps. Firstly, a substrate is provided. Then, a stack is formed on the substrate. The stack includes a plurality of insulating layers and a plurality of conductive layers that are alternately stacked along a first direction. A conductive pillar is formed, wherein the conductive pillar penetrates the stack along the first direction. A memory layer is formed, wherein the memory layer surrounds the conductive pillar. Thereafter, a salicide layer is formed, wherein the salicide layer surrounds the conductive pillar; wherein the memory layer is disposed between the conductive pillar and the salicide layer.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
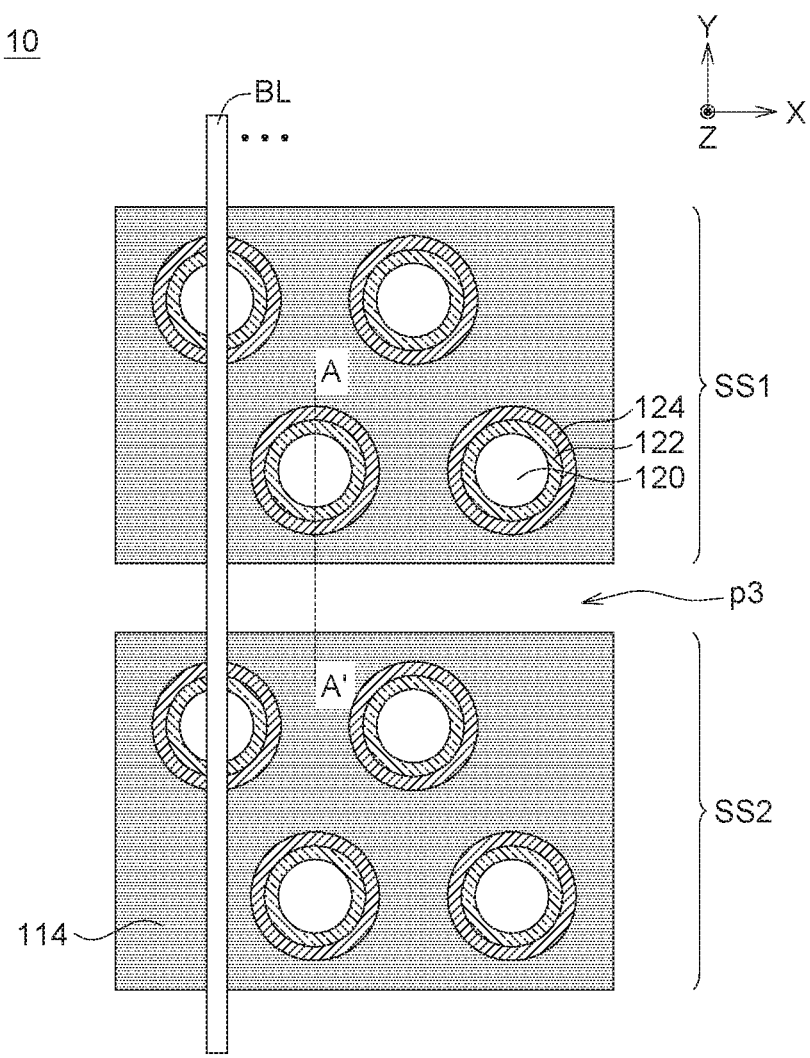
FIG. 1A is a partial top view of a semiconductor device according to an embodiment of the present invention.
Figure 1B:
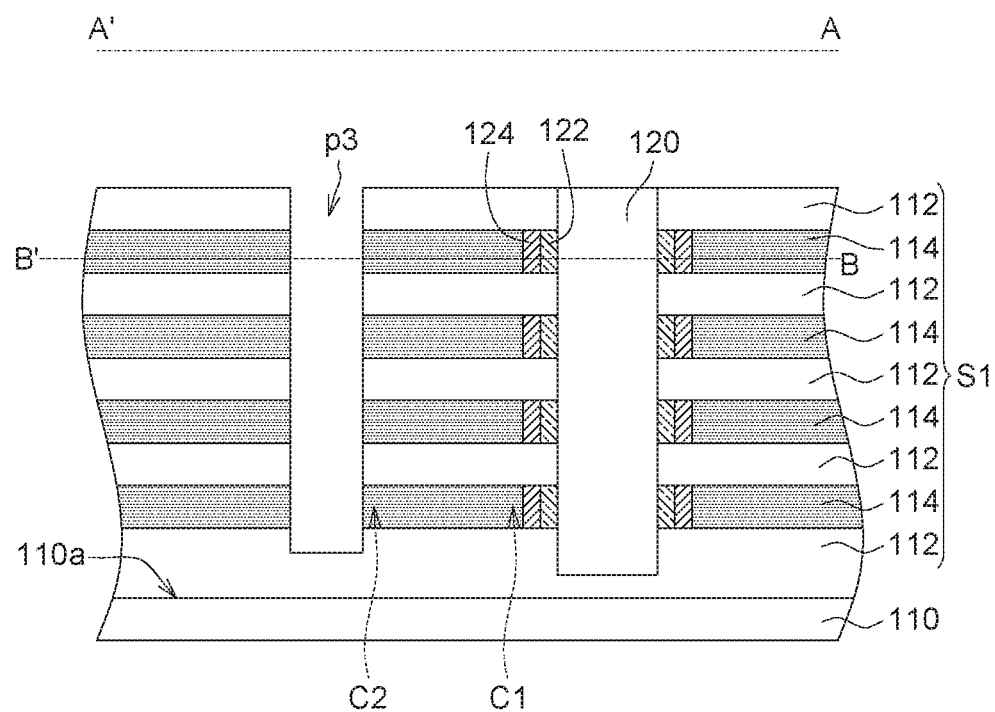
FIG. 1B shows a cross-sectional view taken along the line A-A' of FIG. 1A.

FIG. 1A illustrates a partial top view of a semiconductor device 10 according to an embodiment of the present invention. FIG. 1B shows a cross-sectional view taken along the line A-A' of FIG. 1A. FIG. 1A shows a cross section corresponding to the line B-B' in FIG. 1B.

Referring to FIGS. 1A and 1B, the semiconductor device 10 includes a substrate 110, a stack S1, a plurality of conductive pillars 120, a plurality of memory layers 122, and a plurality of salicide layers 124. The stack S1 is disposed on an upper surface 110a of the substrate 110, wherein the stack S1 includes a plurality of insulating layers 112 and a plurality of conductive layers 114 that are alternately stacked along a first direction (for example, the Z direction). In the present embodiment, the thickness of the lowest insulating layer 112 is greater than the thickness of other insulating layers 112, but the invention is not limited thereto. In the present embodiment, only five insulating layers 112 and four conductive layers 114 are illustrated, but the amount of insulating layers 112 and conductive layers 114 is not limited thereto.

The conductive pillar 120 penetrates the stack S1 along the first direction. There may be a gap between the bottom of the conductive pillar 120 and the upper surface 110a of the substrate 100. The memory layers 122 respectively surround the conductive pillars 120. The salicide layers 124 surround the conductive pillar 120, and the memory layers 122 are disposed between the conductive pillar 120 and the salicide layer 124. The trench p3 penetrates the stack S1 and extends along a second direction (for example, the X direction), dividing the stack S1 into a plurality of sub-stacks SS1, SS2 . . . In some embodiments, a plurality of bit lines BL may extend along a third direction (for example, the Y direction), and the conductive pillars 120 may be electrically connected to the corresponding bit lines BL, respectively.

In one embodiment, the substrate 110 and the insulating layer 112 may be formed of oxide, such as silicon dioxide.

In one embodiment, the conductive layer 114 may be formed of a semiconductor material, such as doped or undoped polysilicon; in particular, it may be p-type or n-type doped polysilicon. In one embodiment, the conductive layer 114 can serve as a word line.

In one embodiment, the material of the conductive pillar 120 is, for example, polysilicon, amorphous silicon, tungsten (W), cobalt (Co), aluminum (Al), tungsten silicide ($WSi_X$), cobalt silicide ($CoSi_X$) or other suitable materials. The cross points between the conductive pillar 120 and each of the memory layers 122 may form a memory cell; a plurality of memory cells arranged along the conductive pillar 120 may form a memory string; and a plurality of memory strings may form a memory array.

In one embodiment, the memory layer 122 includes a resistive memory material, such as a variable resistance random access memory material or a phase change memory material. When the memory layer 122 includes a variable resistance random access memory material, the material of the memory layer 122 is, for example, titanium silicon oxide ($TiSi_XO_Y$) or other suitable variable resistance random access memory material, in order to form a variable resistance random access memory cell at the cross points of the conductive pillar 120 and each of the memory layers 122. When the memory layer 122 includes a phase change memory material, the material of the memory layer 122 is, for example, germanium antimony tellurium (Ge2Sb2Te5 (GST)) or other suitable phase change memory materials, so that phase change memories are formed between the conductive pillar 120 and each of the memory layers 122. In the embodiment, the plurality of memory layers 122 are separated from each other by the insulating layers 112, for example, discontinuously surrounding the conductive pillar 120 in the first direction, but the invention is not limited thereto.

In one embodiment, the material of the salicide layer 124 is, for example, titanium silicide ($TiSi_X$), cobalt silicide ($CoSi_X$) or other suitable salicide. In one embodiment, the salicide layer 124 and each corresponding conductive layer 114 form a Schottky diode, and the Schottky diode can be used as a selector. Since the salicide layer 124 of the present application can form a Schottky diode with the conductive layer 114, and the Schottky diode can be used as a selector, so that the selector is electrically connected to the conductive layer 114 and the memory layer 122, so it can provide the rectifier property in the memory array. The Schottky diode (selector) can perform unipolar operation on the memory to avoid reverse current, so the sneak path in the memory array can be reduced or eliminated, and the problem of current leakage faced by the conventional technique can be solved. In addition, Schottky diodes have very fast switching speeds for the memory operations.

FIGS. 2A to 2H illustrate a manufacturing flowchart of a semiconductor device 10 according to an embodiment of the present invention, for example, corresponding to the position of the cross section taken along the line A-A' in FIG. 1A.

Figure 2A:
FIGS. 2A~2H illustrate a manufacturing flow chart of a semiconductor device according to an embodiment of the present invention.

Referring to FIG. 2A, a substrate 110 is provided, and a stack S1 is formed on the substrate 110 (for example, on the upper surface 110a of the substrate 110). The stack S1 includes a plurality of insulating layers 112 and a plurality of conductive layers 114 that are alternately stacked along a first direction (for example, the Z direction). In the present embodiment, the thickness of the lowest insulating layer 112 is greater than the thickness of other insulating layers 112, but the invention is not limited thereto. In one embodiment, the substrate 110 and the insulating layer 112 may be formed of oxide, such as silicon dioxide. The conductive layers 114 can be formed of a semiconductor material, such as doped or undoped polysilicon; in particular, it can be p-type or n-type doped polysilicon.

Figure 2B:
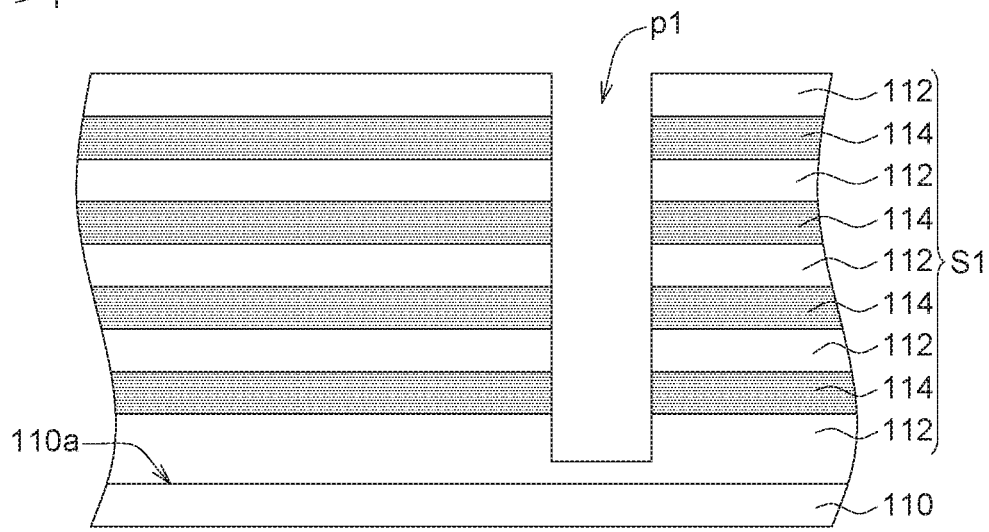

Referring to FIG. 2B, vertical openings p1 are formed, and the vertical openings p1 the stack S1, and the bottom of the vertical openings p1 can be stopped in the lowest insulating layer 112 without exposing the upper surface 110a of the substrate 110. In other words, the bottom of the vertical opening p1 may have a gap with the substrate 110.

Figure 2C:
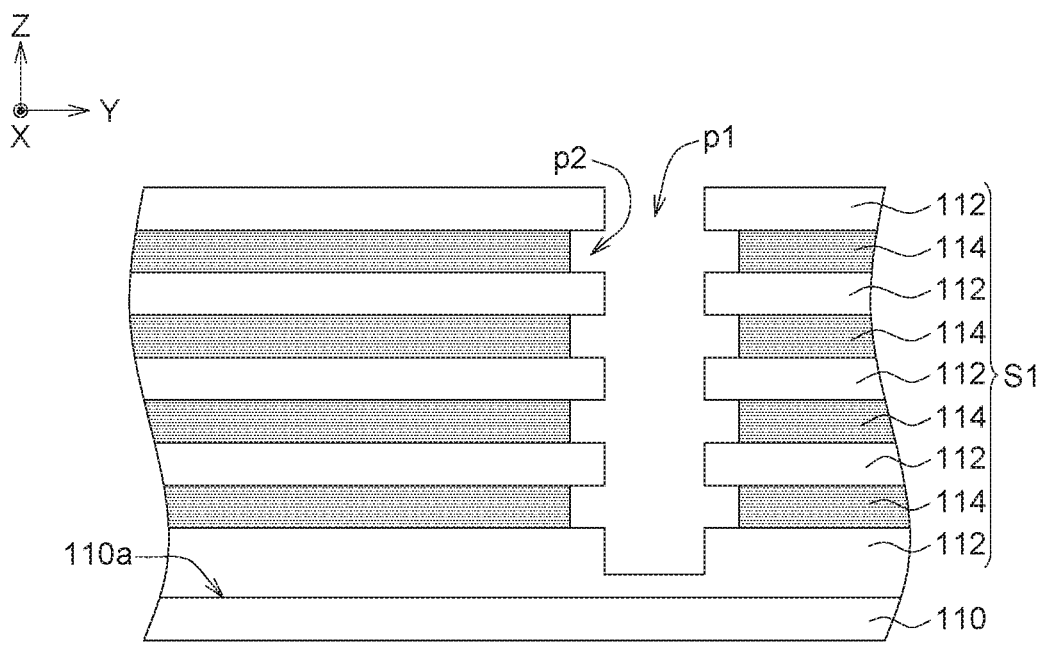

Referring to FIG. 2C, portions of the conductive layers 114 are removed through the vertical opening p1, to form a plurality of first lateral openings p2, wherein the first lateral openings p2 communicate with the vertical opening p1.

Figure 2D:
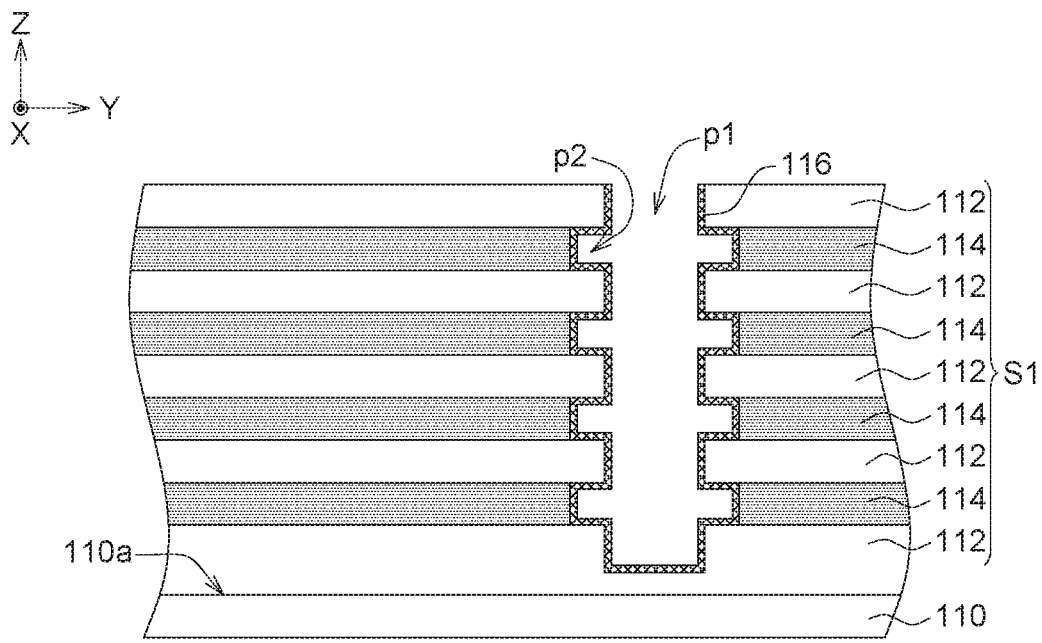

Referring to FIG. 2D, a metal layer 116 is deposited along the sidewalls of the vertical opening p1 and the first lateral openings p2 (for example, by a chemical vapor deposition (CVD)). The material of the metal layer 116 is, for example, titanium (Ti), cobalt (Co), or other suitable metals.

Figure 2E:
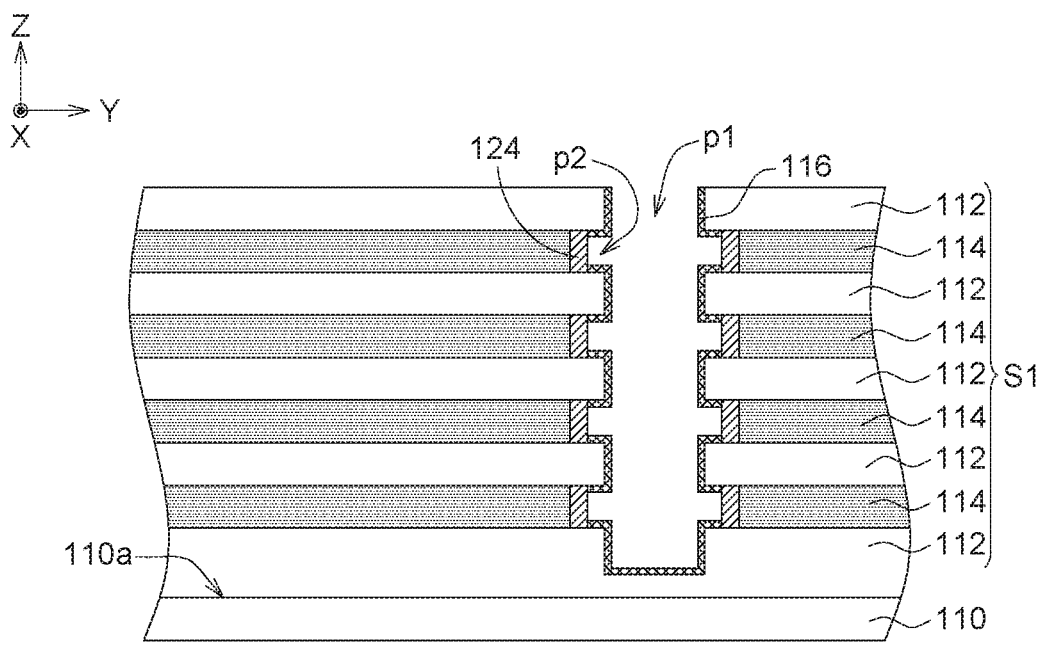

Thereafter, referring to FIG. 2E, a rapid thermal annealing (RTA) process is performed to form a salicide layer 124 on contact surfaces between the metal layer 116 and each of the conductive layers 114. The material of the salicide layer 124 is, for example, titanium silicide ($TiSi_X$), cobalt silicide ($CoSi_X$) or other suitable metal silicide. In some embodiments, the rapid thermal annealing process may be performed twice, but the invention is not limited thereto.

Figure 2F:
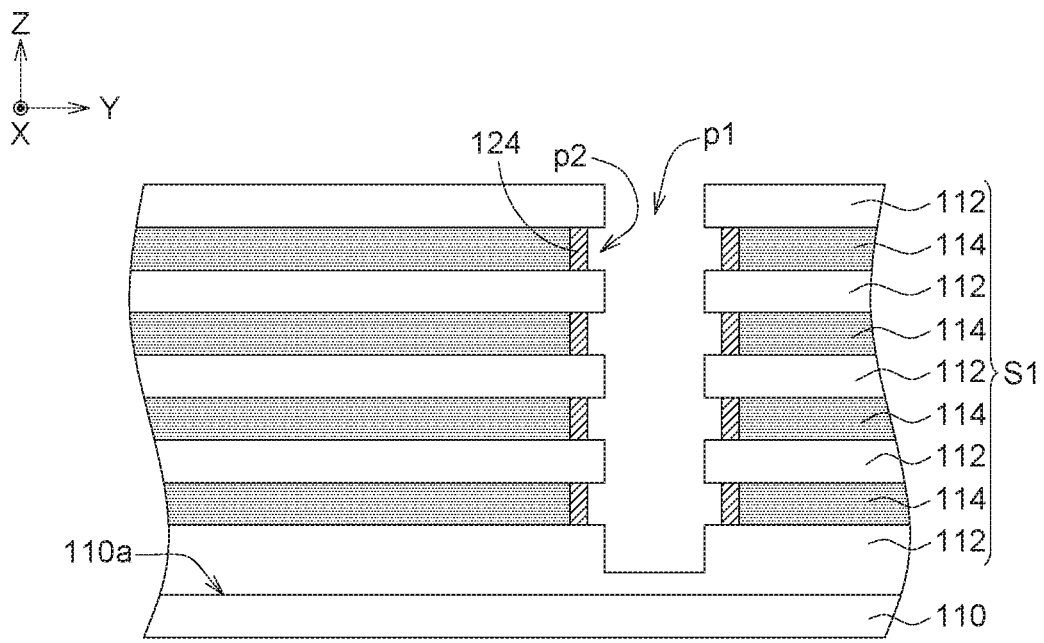

Referring to FIG. 2F, after the salicide layer 124 is formed, the metal layer 116 is removed by a selective etching process, such as a wet etching process.

Figure 2G:
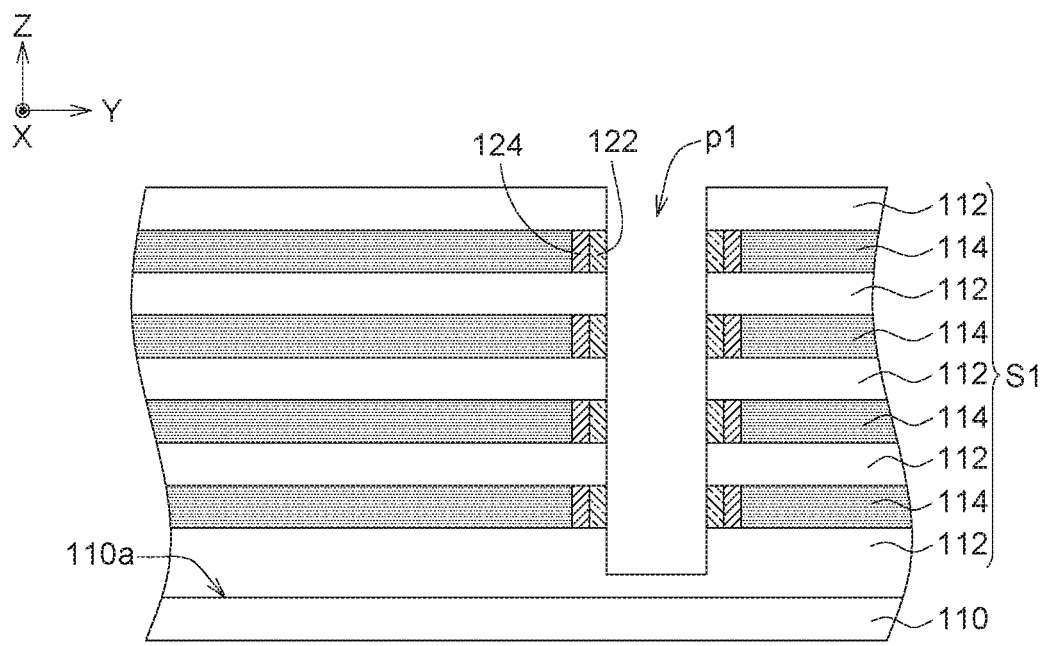

Referring to FIG. 2G, after removing the metal layer 116, an oxidation process is performed to form the memory layers 122 between the vertical opening p1 and the salicide layers 124; alternatively, a deposition process (such as chemical vapor deposition process) can be performed, so that the memory material is deposited in the space between the vertical opening p1 and the salicide layers 124 to form the memory layers 122 between the vertical opening p1 and the salicide layers 124. In one embodiment, when the memory layers 122 are formed by an oxidation process, the memory layers 122 includes a resistive random-access memory material, wherein the memory layers 122 may be oxides of the salicide layers 124. For example, when the salicide layers 124 include titanium silicide ($TiSi_X$), the memory layers 122 may include titanium silicon oxide ($TiSi_XO_Y$). In another embodiment, when the memory layers 122 are formed by a deposition process, the memory layers 122 include a phase change memory material. The material of the memory layers 122 are, for example, Ge2Sb2Te5 (GST) or other suitable phases change memory materials. In some embodiments, an etching process may be performed after the memory layers 122 are formed, to remove excess memory material.

Figure 2H:
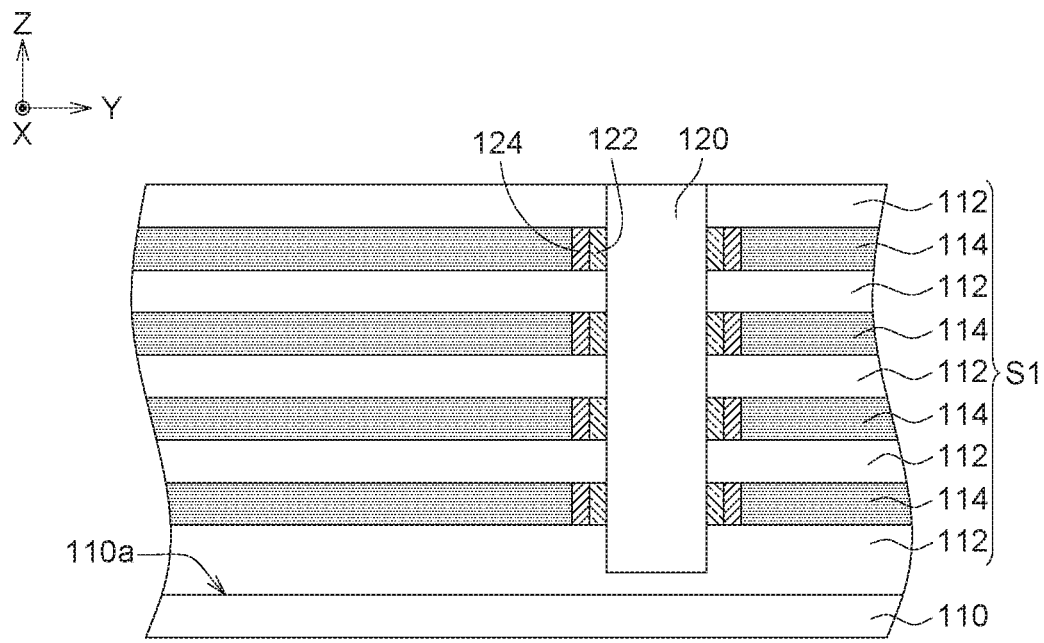

Referring to FIG. 2H, after forming the memory layers 122, a conductive material is filled in the vertical openings p1 to form the conductive pillars 120. The material of the conductive pillars 120 are, for example, platinum (Pt), tungsten (W), cobalt (Co), aluminum (Al), tungsten silicide ($WSi_X$), cobalt silicide ($CoSi_X$), or other suitable materials.

After forming the conductive pillars 120, a trench p3 penetrating the stack S1 and extending along a second direction (for example, the X direction) is formed, where the second direction and the first direction are intersected with each other, and the trench p3 divide the stack S1 into two sub-stacks SS1 and SS2 to form the semiconductor device 10, as shown in FIGS. 1A and 1B. FIGS. 1A-1B only exemplarily show one trench p3 and two sub-stacks, but the invention is not limited thereto, the amount of trenches p3 may be greater than 1, and the amount of sub-stacks may be greater than 2.

In some embodiments, an insulating material may be filled in the trench p3.

Optionally, after the step of forming the trench p3, a doping process (for example, a plasma doping process) may be further performed to the conductive layers 114, so that each of the conductive layers 114 is doped with a dopant (for example, a p-type or n-type dopant), the dopant has a first concentration C1 in the region adjacent to the salicide layer 124, and has a second concentration C2 in the region away from the salicide layer 124, the second concentration C2 is greater than the first concentration C1. In other words, the second concentration C2 of the dopant in the conductive layer 114 adjacent to the trench p3 is greater than the first concentration C1 of the dopant in the conductive layer 114 away from the trench p3, as shown in FIG. 1B, but the invention is not limited thereto.

Figure 2I:
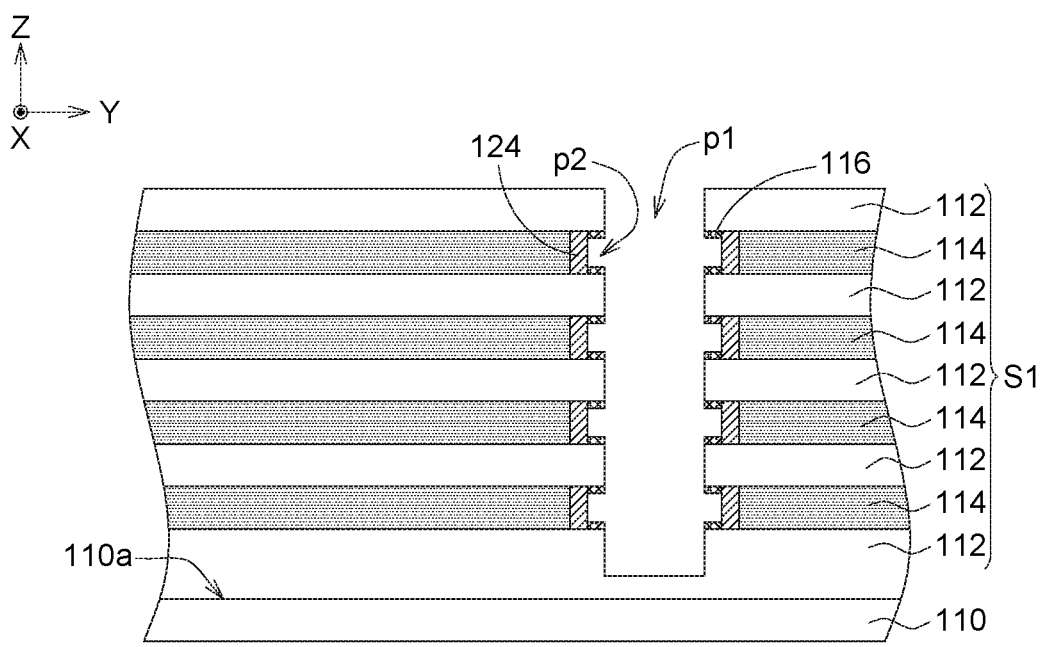
FIG. 2I illustrates another embodiment of the step in FIG. 2F.

FIG. 2I illustrates another embodiment of the step in FIG. 2F.

In some embodiments, after the step of the metal layer 116 removed by the selective etching process, a portion of the metal layer 116 is remained in the first lateral openings p2, as shown in FIG. 2I. Other steps followed by FIG. 2I are identical or similar to the steps shown in FIGS. 2G-2H.

Figure 3A:
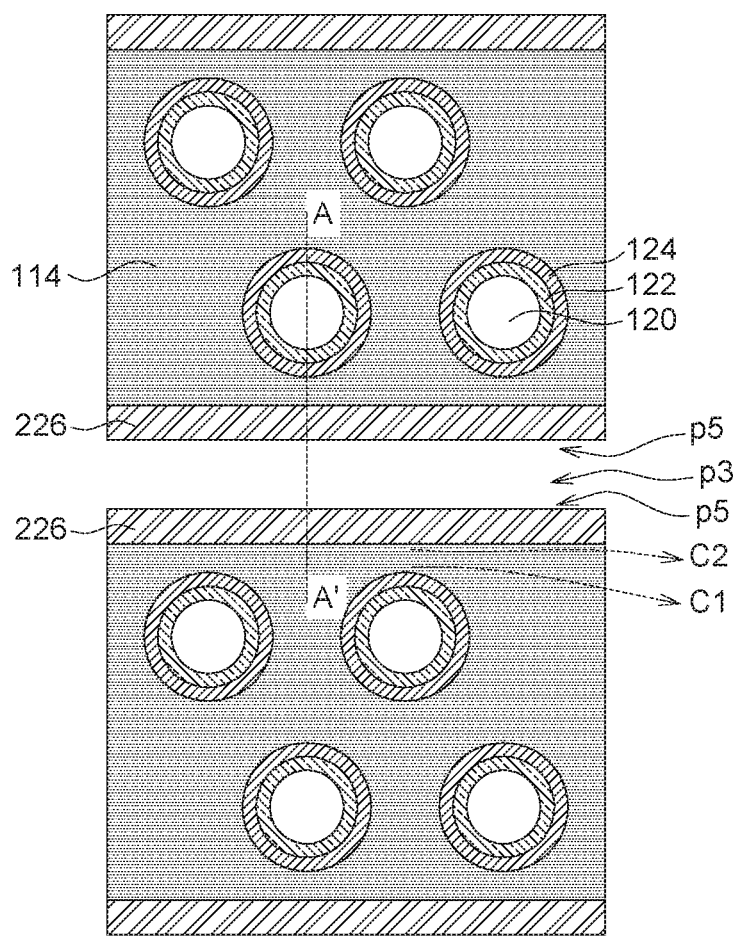
FIG. 3A is a partial top view of a semiconductor device according to an embodiment of the present invention.
Figure 3B:
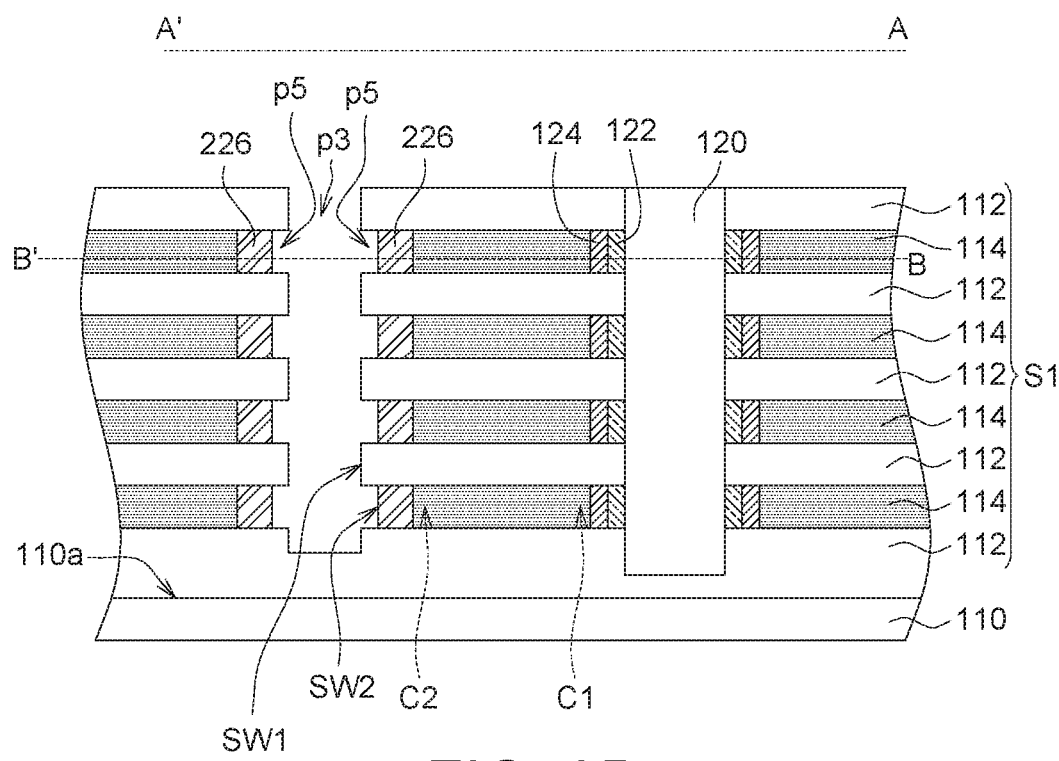
FIG. 3B shows a cross-sectional view taken along the line A-A' of FIG. 3A.

FIG. 3A illustrates a partial top view of a semiconductor device 20 according to an embodiment of the present invention. FIG. 3B shows a cross-sectional view taken along the line A-A' of FIG. 3A. FIG. 3A shows a cross section corresponding to the B-B' line in FIG. 3B.

Referring to FIG. 3A, the semiconductor device 20 is similar to the semiconductor device 10, the difference is in that the semiconductor device 20 further includes sidewall conductor layers 226 adjacent to the conductive layers 114, and other identical or similar elements use the same or similar numerals, and it will not be described in detail herein. The electrical conductivity of the sidewall conductor layers 226 is greater than that of the conductive layers 114. The sidewall conductor layers 226 are disposed on opposite sides of the trench p3. The sidewall conductor layers 226 between different layers are separated from each other by the insulating layers 112 (as shown in FIG. 4C). Compared with the semiconductor device 10, since the semiconductor device 20 has the sidewall conductor layers 226, which can reduce the resistance value of the conductive layers 114, a better ohmic contact can be formed at positions adjacent to the trench p3 in the subsequent process.

In the present embodiment, the conductive layers 114 may be doped with a dopant (which may be p-type or n-type), and the dopant in the conductive layers 114 has a concentration gradient distribution. For example, the dopant has a first concentration C1 in a region adjacent to the salicide layer 124, and has a second concentration C2 in a region away from the salicide layer 124, and the second concentration C2 is greater than the first concentration C1. In other words, in the conductive layer 114, the dopant (which may be p-type or n-type) has a first concentration C1 in a region away from the trench p3, and a second concentration C2 in a region adjacent to the trench p3, and the second concentration C2 is greater than the first concentration C1, but the invention is not limited thereto. In other embodiments, the dopants in the conductive layer 114 may have the same concentration without the above-mentioned phenomenon of concentration gradient distribution.

Figure 4A:
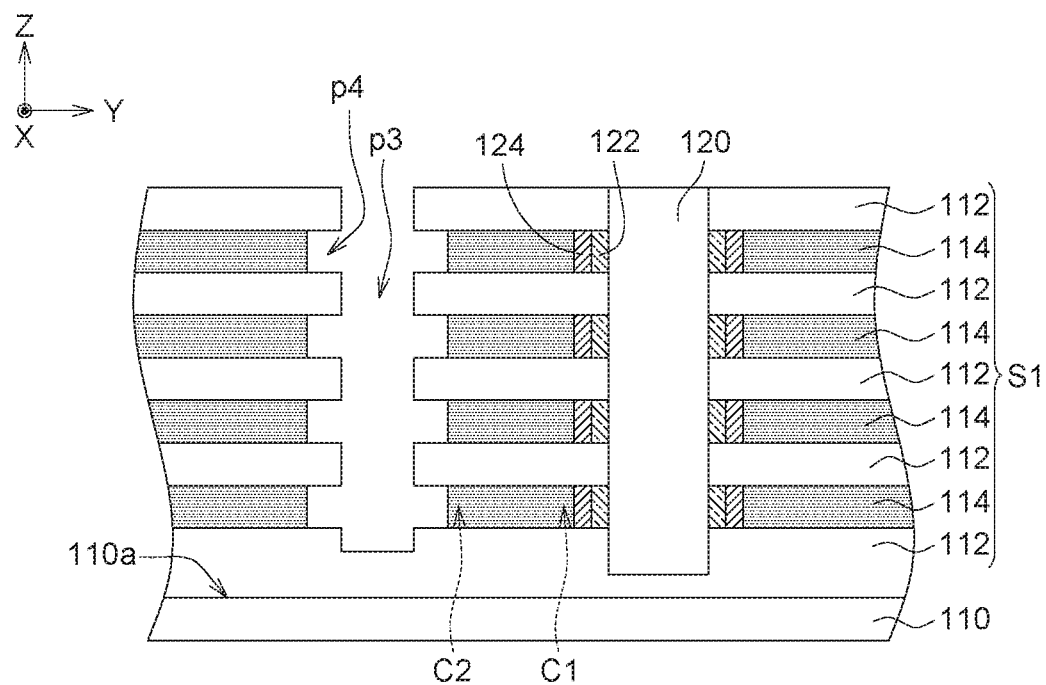
FIGS. 4A-4B illustrate a manufacturing flowchart of a semiconductor device according to an embodiment of the present invention.
Figure 4B:
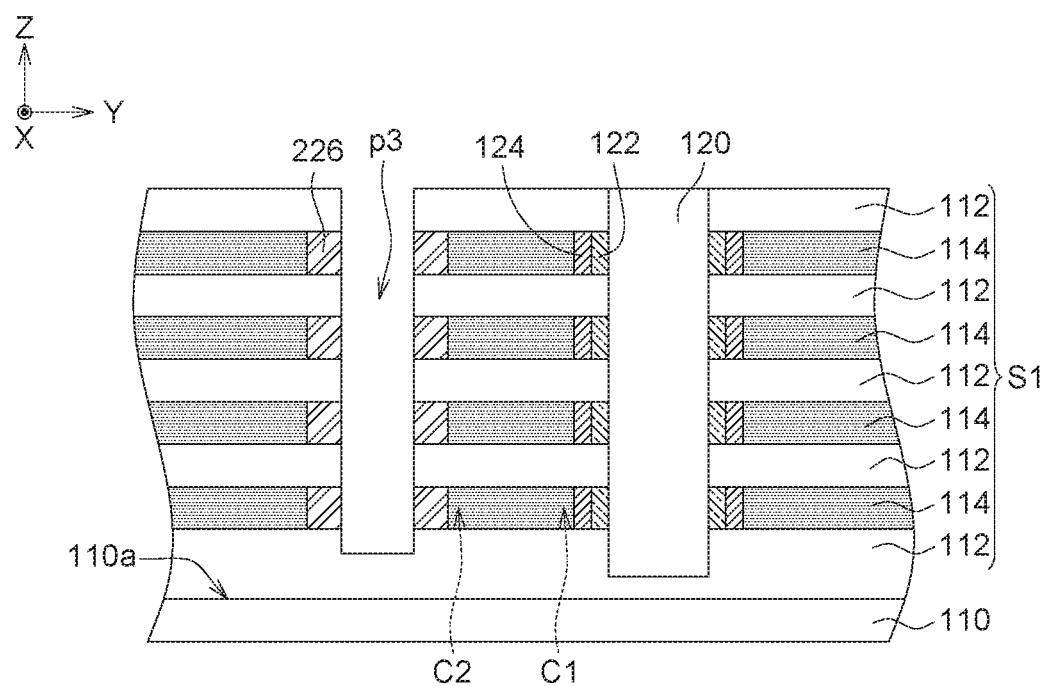

FIGS. 4A-4B illustrate a manufacturing flowchart of a semiconductor device 20 according to an embodiment of the present invention.

Portions of the manufacturing process of the semiconductor device 20 is similar to the manufacturing process of the semiconductor device 10, after performing the process steps shown in FIGS. 2A-2H, referring to FIG. 4A, portions of the conductive layers 114 can be removed through the trench p3, to form a plurality of second lateral openings p4, wherein the second lateral openings p4 communicate with the trench p3. Thereafter, a doping process (for example, a plasma doping process) is performed to the conductive layers 114, so that each of the conductive layers 114 is doped with a dopant (for example, p-type or n-type dopant), and the dopant in a region adjacent to the salicide layer 124 has a first concentration C1, and the dopant in a region away from the salicide layer 124 has a second concentration C2, the second concentration C2 is greater than the first concentration C1, that is, in the conductive layer 114, the second concentration C2 of the dopant (which may be p-type or n-type) in the region adjacent to the trench p3 may be greater than the first concentration C1 of the dopant in the region away from the trench p3.

Since the concentration of the dopant in the conductive layer 114 adjacent to the salicide layer 124 is low, it is advantageous to form a Schottky diode; the concentration of the dopant in the conductive layer 114 adjacent to the trench p3 is high, and it is beneficial to form a better ohmic contact at a position adjacent to the trench p3 (as shown in FIG. 3) in the subsequent process.

Thereafter, referring to FIG. 4B, a conductive material is filled in the second lateral openings p4 to form a plurality of sidewall conductor layers 226, wherein the sidewall conductor layers 226 are adjacent to the conductive layers 114, and the electrical conductivity of the sidewall conductor layers 226 is greater than the electrical conductivity of the conductive layers 114. The material of the sidewall conductor layers 226 is, for example, tungsten (W), cobalt (Co), aluminum (Al), tungsten silicide ($WSi_x$), or cobalt silicide ($CoSi_x$). Since the sidewall conductor layers 226 are adjacent to the conductive layers 114, and the electrical conductivity of the sidewall conductor layers 226 is greater than the electrical conductivity of the conductive layers 114, it is more advantageous to form a better ohmic contact at a position adjacent to the trench p3 in the subsequent process.

Thereafter, portions of the sidewall conductor layers 226 may be removed by an etch-back process to form a plurality of third lateral openings p5. The third lateral openings p5 may communicate with the trench p3, and semiconductor device 20 is formed, as shown in FIG. 3B. In one embodiment, the outer sidewall SW1 of the insulating layer 112 is farther away from the conductive pillar 120 than the outer sidewall SW2 of the sidewall conductor layer 226.

In some embodiments, an insulating material may be filled in the trench p3 and the third lateral openings p5.

Figure 5:
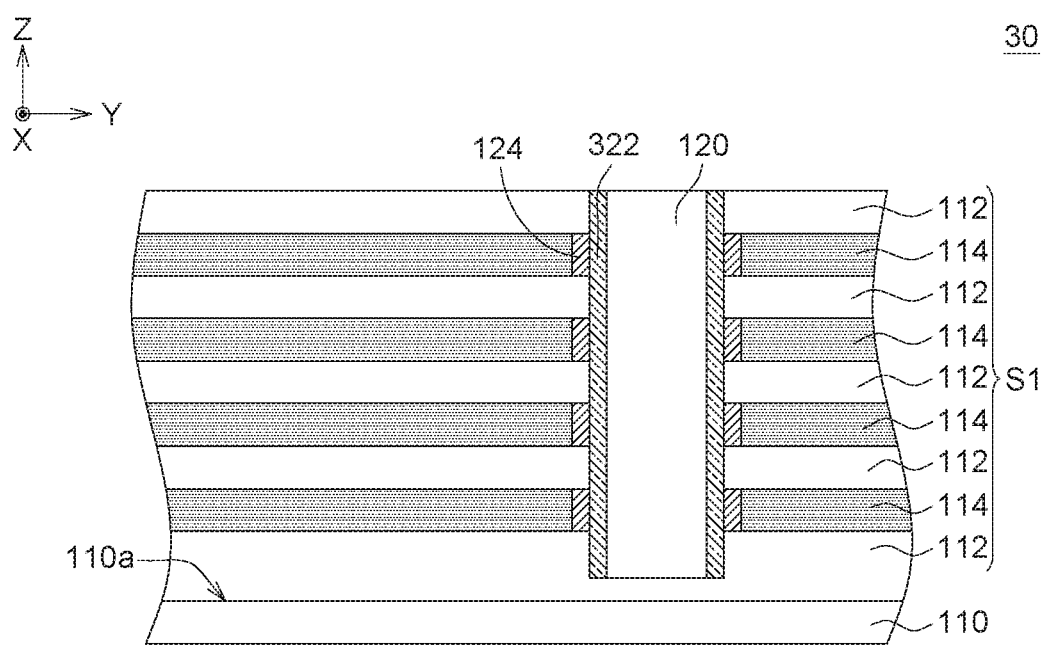
FIG. 5 is a cross-sectional view of a semiconductor device according to an embodiment of the present invention.

FIG. 5 is a cross-sectional view of a semiconductor device 30 according to an embodiment of the present invention. The semiconductor device 30 is similar to the semiconductor device 20, except for the structure of the memory layer 322. The same elements use the same numerals and it will not be described in detail herein.

Referring to FIG. 5, the memory layer 322 surrounds the conductive pillar 120; extends along the first direction and corresponds to the plurality of conductive layers 114. For example, the memory layer 322 continuously extends between the stack S1 and the conductive pillar 120 and has the same height as the conductive pillar 120 in the first direction. The material of the memory layer 322 is, for example, a resistive random access memory material, but the present invention is not limited thereto. The memory layer 322 may include titanium silicon oxide ($TiSi_XO_Y$), cobalt silicide ($CoSi_XO_Y$), or other suitable materials. Compared with the comparative example in which the memory layer does not extend along the first direction, the manufacturing process of the present embodiment is simpler.

Figure 6:
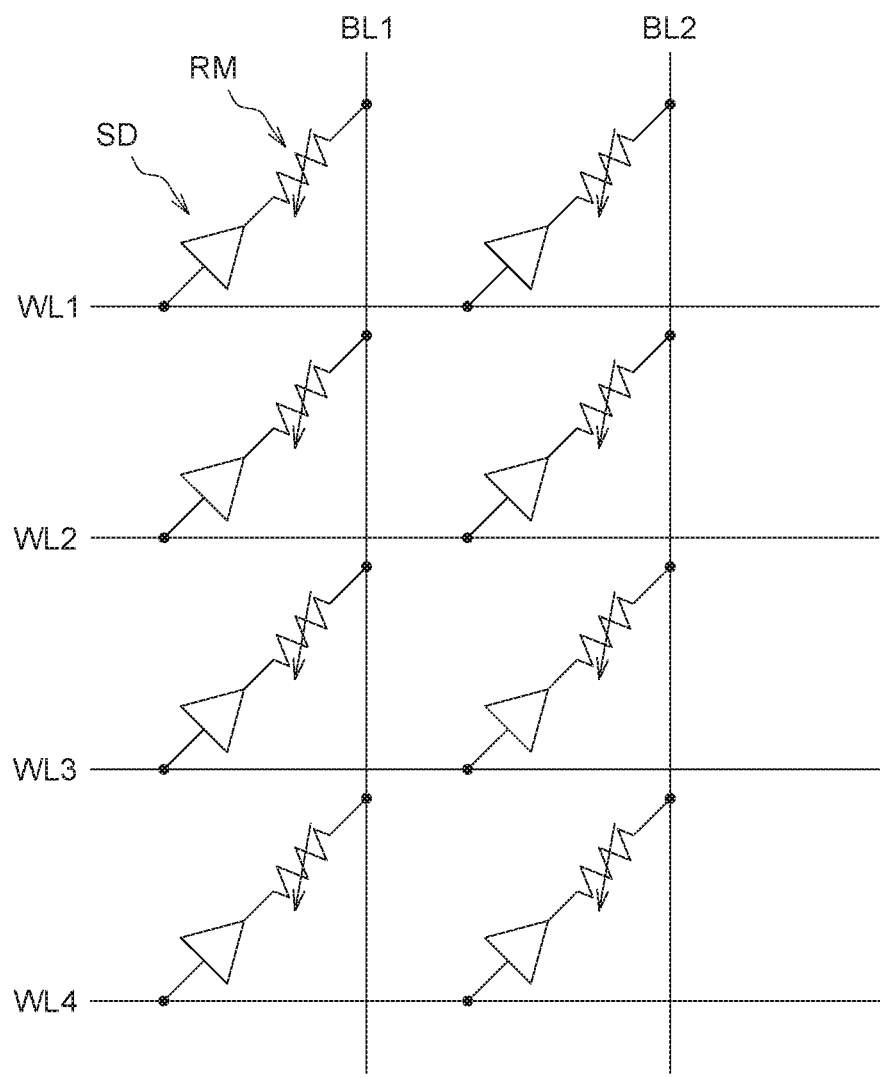
FIG. 6 shows an equivalent circuit diagram of a semiconductor device according to an embodiment of the present invention.

FIG. 6 illustrates an equivalent circuit diagram of semiconductor devices 10 to 30 according to an embodiment of the invention.

Referring to FIG. 6, it exemplarily shows two memory strings, and two conductive pillars 120 are respectively electrically connected to the bit lines BL1 and BL2, and four conductive layers 114 can be used as word lines WL1 to WL4, respectively. Each of the cross points between the conductive layers 114 and the conductive pillar 120 has a schottky diode SD (for example, used as a selector) and a memory RM (for example, resistive memory) connected to each other.

According to one embodiment, a semiconductor device is provided. The semiconductor device includes a substrate, a stack, a conductive pillar, a memory layer, and a salicide layer. The stack is disposed on the substrate, wherein the stack includes a plurality of insulating layers and a plurality of conductive layers that are alternately stacked along a first direction. The conductive pillar penetrates the stack along the first direction. The memory layer surrounds the conductive pillar. The salicide layer surrounds the conductive pillar, wherein the memory layer is disposed between the conductive pillar and the salicide layer.

Since the salicide layer of the present invention can form Schottky diode with the conductive layer, and the Schottky diode can be used as a selector, so that the selector is electrically connected to the conductive layer and the memory layer, it can provide rectifier property in the memory array. The Schottky diodes (selectors) can perform unipolar operation on the memory to avoid reverse currents. Therefore, the sneak path in the memory array can be reduced or eliminated, and the problem of current leakage faced by the known technique can be solved. In addition, the Schottky diode have very fast switching speeds for memory operations.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a substrate;
   a stack disposed on the substrate, wherein the stack comprises a plurality of insulating layers and a plurality of conductive layers that are alternately stacked along a first direction;
   a conductive pillar penetrating the stack along the first direction;
   a memory layer surrounding the conductive pillar; and
   a salicide layer surrounding the conductive pillar, wherein the memory layer is disposed between the conductive pillar and the salicide layer,
   wherein the conductive layers include polysilicon, and the salicide layer is disposed between the memory layer and the conductive layer, and the salicide layer is directly connected to the conductive layer.

2. The semiconductor device according to claim 1, wherein the memory layer comprises a resistive memory material.

3. The semiconductor device according to claim 1, wherein the memory layer comprises a resistive random access memory material.

4. The semiconductor device according to claim 1, wherein the memory layer comprises a phase change memory material.

5. The semiconductor device according to claim 1, wherein the salicide layer and one conductive layer of the conductive layers form a Schottky diode.

6. The semiconductor device according to claim 2, wherein the Schottky diode is used as a selector.

7. The semiconductor device according to claim 1, wherein each of the conductive layers is doped with a dopant, and the dopant in a region adjacent to the salicide layer has a first concentration, and the dopant in a region far away from the salicide layer has a second concentration, and the second concentration is greater than the first concentration.

8. The semiconductor device according to claim 1, further comprising a plurality of sidewall conductor layers, the sidewall conductor layers are adjacent to the conductive layers, wherein an electrical conductivity of the sidewall conductor layers is greater than an electrical conductivity of the conductive layers.

9. The semiconductor device according to claim 1, further comprising a plurality of the memory layers, the memory layers are separated from each other by the insulating layers.

10. The semiconductor device of claim 1, wherein the memory layer extends along the first direction and corresponds to the conductive layers.

11. A method for manufacturing a semiconductor device, comprising:
    providing a substrate;
    forming a stack disposed on the substrate, wherein the stack comprises a plurality of insulating layers and a plurality of conductive layers that are alternately stacked along a first direction;
    forming a conductive pillar penetrating the stack along the first direction;
    forming a memory layer surrounding the conductive pillar; and
    forming a salicide layer surrounding the conductive pillar, wherein the memory layer is disposed between the conductive pillar and the salicide layer,
    wherein the conductive layers include polysilicon, and the salicide layer is disposed between the memory layer and the conductive layer, and the salicide layer is directly connected to the conductive layer.

12. The method for manufacturing a semiconductor device according to claim 11, wherein the memory layer comprises a resistive memory material.

13. The method for manufacturing a semiconductor device according to claim 11, wherein the step of forming the salicide layer comprises:
    forming a vertical opening, wherein the vertical opening penetrates the stack;
    removing portions of the conductive layers to form a plurality of first lateral openings, wherein the first lateral openings communicate with the vertical opening;
    depositing a metal layer along sidewalls of the vertical opening and the first lateral openings; and performing a rapid thermal annealing process to form the salicide layer on a contact surface between the metal layer and each of the conductive layers.

14. The method for manufacturing a semiconductor device according to claim 13, further comprising:
removing the metal layer after forming the salicide layer;
performing an oxidation process to form the memory layer between the vertical opening and the salicide layer; and
filing a conductive material in the vertical opening to form the conductive pillar.

15. The method for manufacturing a semiconductor device according to claim 13, further comprising:
removing the metal layer after forming the salicide layer;
performing a deposition process to form the memory layer between the vertical opening and the salicide layer; and
filling a conductive material in the vertical opening to form the conductive pillar.

16. The method for manufacturing a semiconductor device according to claim 11, further comprising:
forming a trench penetrating the stack and extending along a second direction, wherein the second direction and the first direction are intersected with each other, and the trench divides the stack into 2 sub-stacks;
removing portions of the conductive layers to form a plurality of second lateral openings, wherein the second lateral openings communicate with the trench;
performing a doping process to the conductive layers, so that each of the conductive layers is doped with a dopant, and the dopant in a region adjacent to the salicide layer has a first concentration, the dopant in a region far away from the salicide layer has a second concentration, and the second concentration is greater than the first concentration; and
filling a conductive material in the second lateral openings to form a plurality of sidewall conductor layers, wherein the sidewall conductor layers are adjacent to the conductive layers, wherein an electrical conductivity of the sidewall conductor layers is greater than an electrical conductivity of the conductive layers.

17. The method for manufacturing a semiconductor device according to claim 11, further comprising:
forming a trench penetrating the stack and extending along a second direction, wherein the second direction and the first direction are intersected with each other, and the trench divides the stack into 2 sub-stacks; and
performing a doping process to the conductive layers, so that each of the conductive layers is doped with a dopant, the dopant in a region adjacent to the salicide layer has a first concentration, the dopant in a region far away from the salicide layer has a second concentration, and the second concentration is greater than the first concentration.

18. The method for manufacturing a semiconductor device according to claim 11, further comprising:
forming a trench penetrating the stack and extending along a second direction, wherein the second direction and the first direction are intersected with each other, and the trench divides the stack into 2 sub-stacks;
removing portions of the conductive layers to form a plurality of second lateral openings, wherein the second lateral openings communicate with the trench; and
filling a conductive material in the second lateral openings to form a plurality of sidewall conductor layers, wherein the sidewall conductor layers are adjacent to the conductive layers, and an electrical conductivity of the sidewall conductor layers is greater than an electrical conductivity of the conductive layers.

19. The method for manufacturing a semiconductor device according to claim 11, further comprising:
forming a plurality of the memory layers, the memory layers are separated from each other by the insulating layers.

20. The method for manufacturing a semiconductor device of claim 11, wherein the memory layer extends along the first direction and corresponds to the conductive layers.

* * * * *